US010203541B2

(12) United States Patent
Wang et al.

(10) Patent No.: US 10,203,541 B2
(45) Date of Patent: Feb. 12, 2019

(54) DISPLAY SUBSTRATE AND METHOD FOR MANUFACTURING THE SAME, AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Rui Wang, Beijing (CN); Fei Shang, Beijing (CN); Jaikwang Kim, Beijing (CN); Sijun Lei, Beijing (CN); Shaoru Li, Beijing (CN)

(73) Assignees: BOE TECHNOLOGY GROUP CO., LTD. (CN); CHONGQING BOE OPTOELECTRONICS TECHNOLOGY CO., LTD. (CN)

( * ) Notice: Subject to any disclaimer, the term of this patent is extended or adjusted under 35 U.S.C. 154(b) by 9 days.

(21) Appl. No.: 15/521,905

(22) PCT Filed: Dec. 10, 2015

(86) PCT No.: PCT/CN2015/097010
§ 371 (c)(1),
(2) Date: Apr. 26, 2017

(87) PCT Pub. No.: WO2017/024708
PCT Pub. Date: Feb. 16, 2017

(65) Prior Publication Data
US 2017/0336670 A1 Nov. 23, 2017

(30) Foreign Application Priority Data
Aug. 7, 2015 (CN) .......................... 2015 1 0483812

(51) Int. Cl.
*G02F 1/1335* (2006.01)
*G02F 1/1362* (2006.01)
(Continued)

(52) U.S. Cl.
CPC .. *G02F 1/133512* (2013.01); *G02F 1/136286* (2013.01); *H01L 27/1214* (2013.01);
(Continued)

(58) Field of Classification Search
CPC ............. G02F 1/1345; G02F 1/136204; G02F 2001/133388; G02F 1/133512; G02F 1/136286; H01L 27/1214
See application file for complete search history.

(56) References Cited

U.S. PATENT DOCUMENTS

| 6,268,895 B1 | 7/2001 | Shimada et al. |
| 2005/0062910 A1 | 3/2005 | Chu et al. |
| 2008/0006858 A1* | 1/2008 | Liu .................. G02F 1/1345 257/294 |

FOREIGN PATENT DOCUMENTS

| CN | 1763948 A | 4/2006 |
| CN | 103424925 A | 12/2013 |

(Continued)

OTHER PUBLICATIONS

First Office Action for Chinese Application No. 201510483812.0, dated Nov. 25, 2016, 5 Pages.
(Continued)

*Primary Examiner* — A. Sefer
(74) *Attorney, Agent, or Firm* — Brooks Kushman P.C.

(57) ABSTRACT

A display substrate, a method for manufacturing the display substrate, and a display device are provided. The display substrate includes a display area and a non-display area surrounding the display area. The non-display area of the
(Continued)

display substrate includes a shading pattern, to prevent light from being transmitted through the non-display area.

20 Claims, 5 Drawing Sheets

(51) Int. Cl.
     *H01L 27/12*      (2006.01)
     *G02F 1/1333*      (2006.01)

(52) U.S. Cl.
     CPC .. *G02F 1/133308* (2013.01); *G02F 1/133345* (2013.01); *G02F 2001/133388* (2013.01)

(56) References Cited

FOREIGN PATENT DOCUMENTS

| | | |
|---|---|---|
| CN | 105093744 A | 11/2015 |
| TW | 200512513 A | 4/2005 |

OTHER PUBLICATIONS

Second Office Action for Chinese Application No. 201510483812.0, dated Apr. 14, 2017, 3 Pages.

International Search Report and Written Opinion for Application No. PCT/CN2015/097010, dated May 13, 2016, 10 Pages.

* cited by examiner

DISPLAY SUBSTRATE AND METHOD FOR MANUFACTURING THE SAME, AND DISPLAY DEVICE

CROSS-REFERENCE TO RELATED APPLICATIONS

This application is the U.S. national phase of PCT Application No. PCT/CN2015/097010 filed on Dec. 10, 2015, which claims priority to Chinese Patent Application No. 201510483812.0 filed on Aug. 7, 2015, the disclosures of which are incorporated in their entirety by reference herein.

TECHNICAL FIELD

The present disclosure relates to the field of display technology, in particular to a display substrate and a method of manufacturing the same, and a display device.

BACKGROUND

Since liquid crystals themselves do not emit light, an external backlight source is required to achieve display in various liquid crystal displays (LCDs) such as liquid crystal displays, liquid crystal televisions. As shown in FIG. 1, a LCD module includes a backlight module and a display panel. The display panel includes an array substrate 10' and a color filter substrate 20 that are oppositely arranged to form a cell, and is sealed by sealant 30. A space to be filled with liquid crystal is formed between the array substrate 10' and the color filter substrate 20. The color filter substrate 20 includes a black matrix 21 for defining a plurality of sub-pixel regions, each of which is provided with a color filter resin layer for achieving color display. The backlight module includes a backlight assembly (not shown), a rubber frame 40 and an optical film 60 (including a brightening film, a diffusion film, etc.). The display panel is arranged on the rubber frame 40, and the light emitted from the backlight assembly is adjusted by the optical film 40, and then is provided to the display panel for displaying. The display panel and the backlight module are fixed and assembled by a front frame 50.

In the related art, a bezel of the liquid crystal display device usually has a problem of light leakage through a gap, which is an urgent technical problem since customers have serious complaints thereon. The bezel of the LCD generally corresponds to a part of the front frame 50 located at a side of the display panel that displays an image.

SUMMARY

The present disclosure provides a display substrate, a method for manufacturing the display substrate and a display device, so as to prevent light leakage through the gap at the bezel of the display device.

In one aspect, the present disclosure provides in at least one embodiment a display substrate. The display substrate includes a display area and a non-display area surrounding the display area, wherein shading patterns are formed on a base and at the non-display area, to prevent light from being transmitted through the non-display area.

In another aspect, the present disclosure provides in at least one embodiment a method for manufacturing the display substrate. The display substrate includes a display area and a non-display area surrounding the display area. The method includes: forming shading patterns on a base and at the non-display area, to prevent light from being transmitted through the non-display area.

At least one embodiment of the present disclosure further provides a display device including the above-mentioned display substrate.

The above-mentioned technical solution of the present disclosure has the following beneficial effects: the non-display area of the display substrate includes the shading pattern, so that the whole non-display area does not transmit the light and thus the light cannot pass through the non-display area of the display substrate. As a result, it enables to prevent light leakage through the gap at the bezel of the display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be specifically described in conjunction with accompanying drawings and embodiments. The following embodiments are merely illustrative of the present disclosure and are not intended to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The technical solutions of the embodiments of the present disclosure will be clearly and completely described below with reference to the accompanying drawings of the embodiments of the present disclosure. Apparently, the described embodiments are only part of the embodiments of the present disclosure, but not all of the embodiments. All other embodiments obtained by a person of ordinary skills in the art based on the described embodiments of the present disclosure are intended to be within the scope of the present disclosure.

Figure 1:
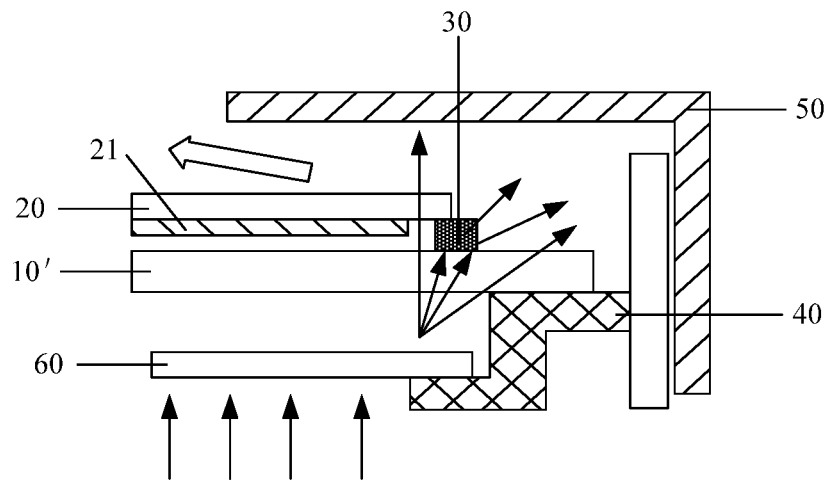
FIG. 1 shows a partial structure diagram of a LCD in the related art.
Figure 2:
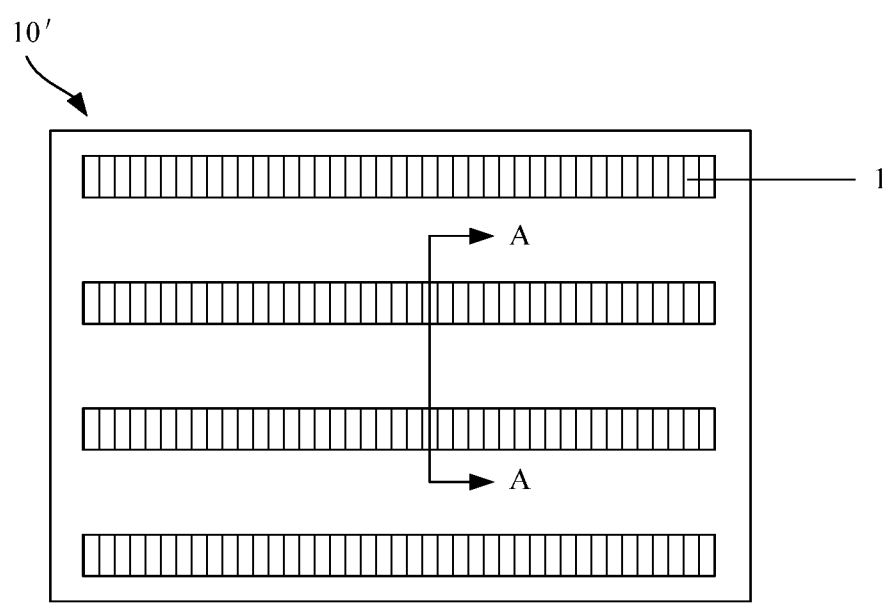
FIG. 2 shows a partial structure diagram of a fan-shaped section of a thin film transistor (TFT) array substrate in the related art.
Figure 3:
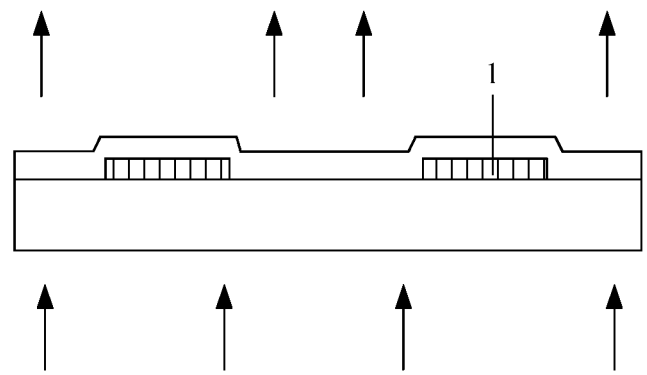
FIG. 3 shows a cross-sectional view taken along a line A-A in FIG. 2.

In order to prevent light leakage through the gap at the bezel of the LCD, inventors analyze the reasons for the light leakage and find the position where the light leakage occurs coincides with the position of the lines on the corresponding bezel of the array substrate. As shown in FIGS. 1-3 (wherein the arrow direction indicates the propagation direction of light), the corresponding bezel of the array substrate 10' is provided with shading lines 1 which are spaced apart from each other. Light emitted from the backlight source may pass through the areas between each two adjacent shading lines 1, and the light transmittance is up to about 73%. Since there exists a gap between the edge of the black matrix 21 and the edge of the color filter substrate 20, and the sealant 30 also has a strong light scattering effect, the light passing through the areas between the shading lines 1 may be transmitted through the gap between the front frame 50 and the display panel, resulting in the light leakage at the bezel of the display device.

Based on the above analysis, in order to prevent light leakage through the gap at the bezel of the display device, the present disclosure provides a display substrate which includes a display area and a non-display area surrounding the display area, wherein shading patterns are formed on a base and at the non-display area, to prevent light from being transmitted through the non-display area. As a result, light cannot pass through the non-display area of the display substrate, thereby preventing light leakage through the gap at the bezel of the display device.

The technical solution of the present disclosure is applicable to not only the LCDs, but also other display devices having the problem of light leakage through the gap at the bezel due to the light transmittance of the non-display area.

The present disclosure will be specifically described in conjunction with accompanying drawings and embodiments. The following embodiments are merely illustrative of the present disclosure and are not intended to limit the scope of the present disclosure.

The technical solution of the present disclosure will be described by taking the LCD as an example in at least one embodiment of the present disclosure.

Figure 4:
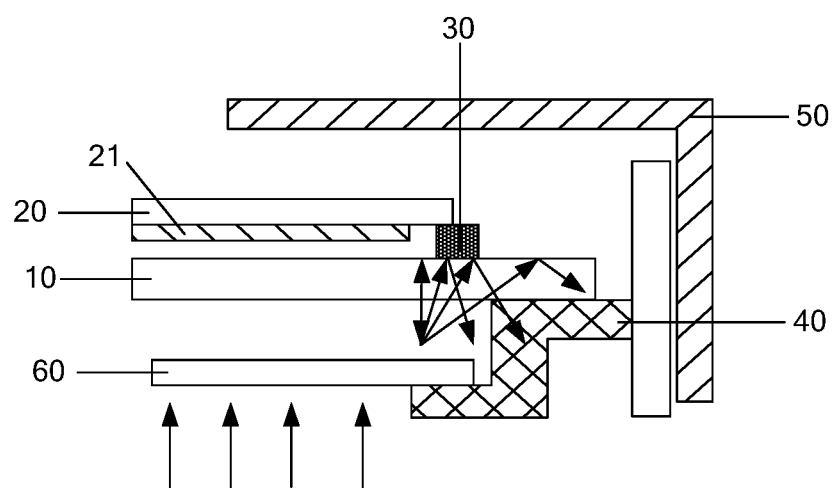
FIG. 4 shows a partial structure diagram of a LCD according to at least one embodiment of the present disclosure.
Figure 7:
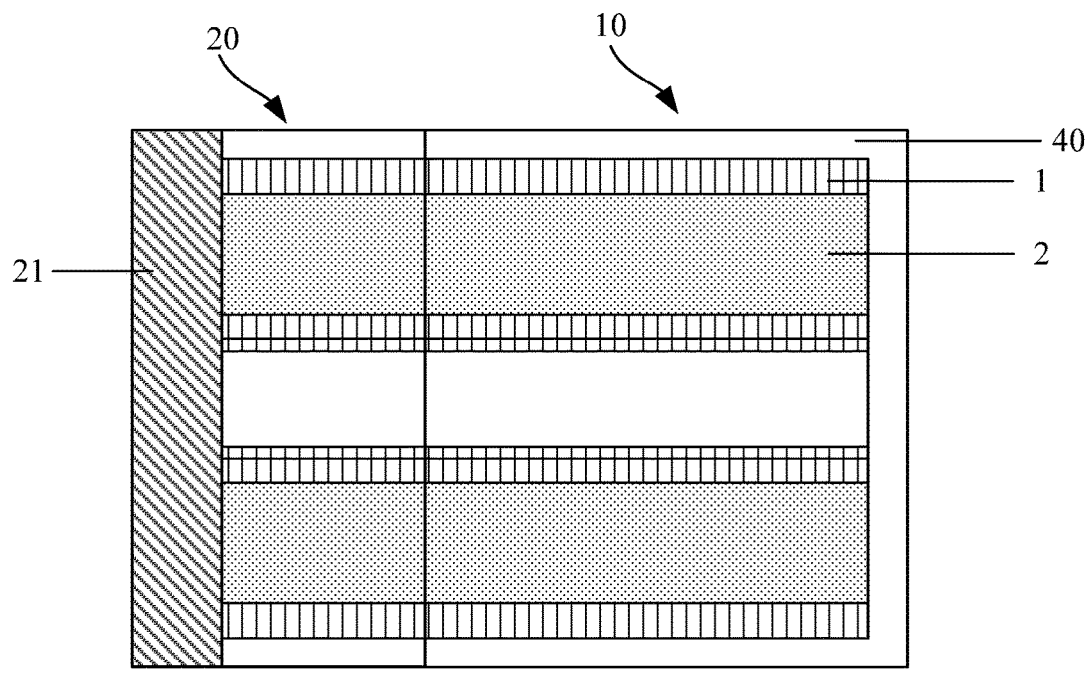
FIG. 7 shows a partial structure diagram of the position of the bezel of the display device corresponding to the liquid crystal display panel according to at least one embodiment of the present disclosure.

FIG. 4 shows a partial structure diagram of a LCD of at least one embodiment of the present disclosure, and FIG. 7 shows a partial structure diagram of the position of the bezel of the display device corresponding to the liquid crystal panel of at least one embodiment of the present disclosure.

As shown in FIGS. 4 and 7, the display substrate 10 of at least one embodiment of the present disclosure includes a display area and a non-display area surrounding the display area, and the non-display area corresponds to the bezel of the display device.

The non-display area of the display substrate 10 includes a plurality of shading lines 1 on the base 100, which is configured to provide display signals to the display area. The areas between each two adjacent shading lines 1 are provided with shading patterns 2 respectively, and the shading patterns 2 cooperate with the shading lines 1 to ensure that the light is prevented from being transmitted through an entirety of the non-display area of the display substrate 10, so that light cannot pass through the non-display area of the display substrate 10, and thus the problem of light leakage through the gap at the bezel of the display device may be solved.

Specifically, as shown in FIG. 4 (wherein the arrow direction indicates the propagation direction of the light), for the LCD, when no light passes through the non-display area of the display substrate 10, no light is transmitted through the gap between the edge of the color filter substrate 20 and the edge of the black matrix 21 on the color filter substrate 20, and no light is scattered by the sealant 30, so that no light is transmitted through the gap between the front frame 50 and the display panel and thus the problem of light leakage through the gap at the bezel of the LCD is solved.

Figure 5:
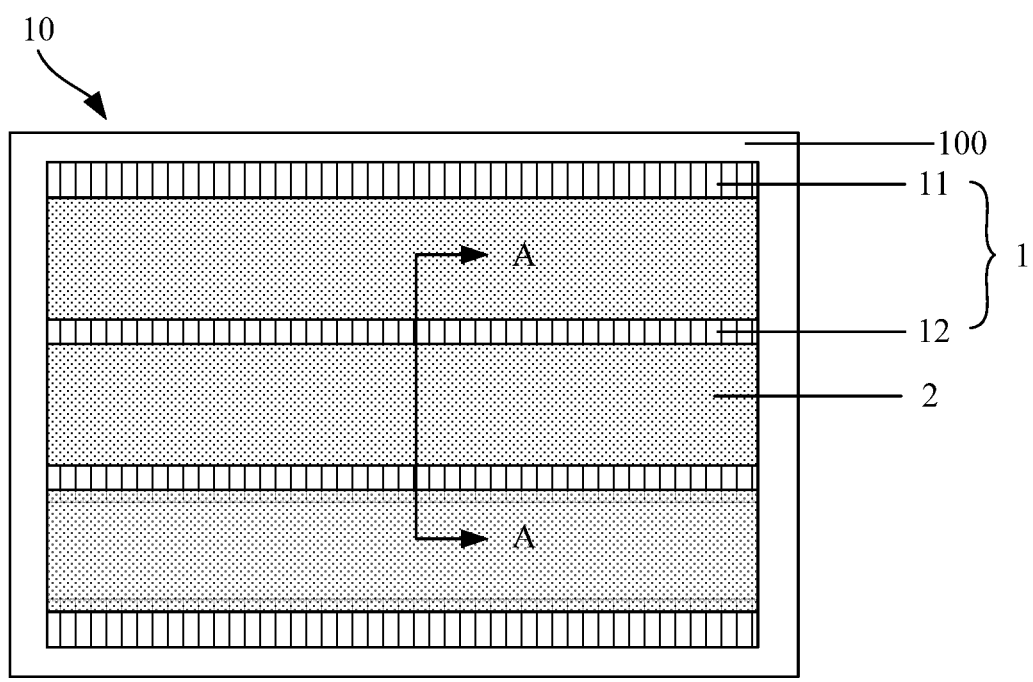
FIG. 5 shows a partial structure diagram of a fan-shaped section of a TFT array substrate according to at least one embodiment of the present disclosure.
Figure 6:
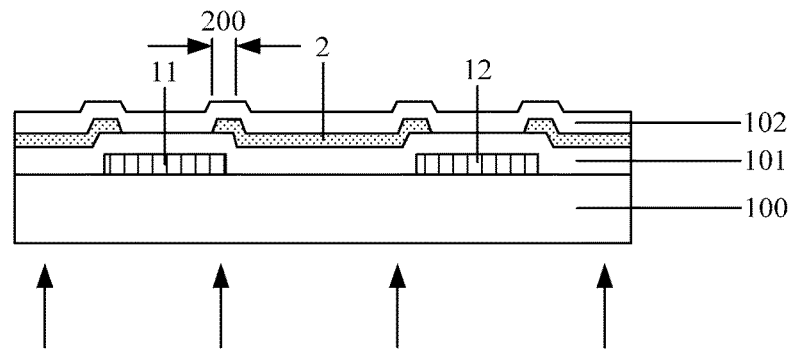
FIG. 6 shows a first cross-sectional view taken along a line A-A in FIG. 5 according to an embodiment of the present disclosure.
Figure 8:
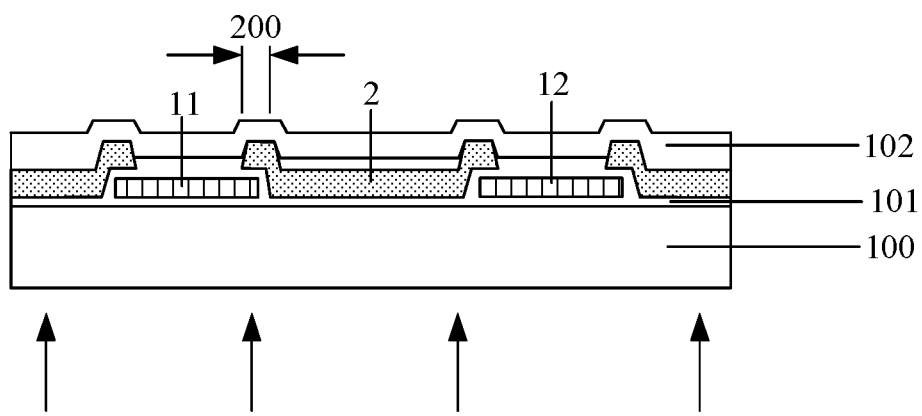
FIG. 8 shows a second cross-sectional view taken along a line A-A in FIG. 5 according to another embodiment of the present disclosure.

FIG. 5 shows a partial structure diagram of a fan-shaped section of a TFT array substrate of at least one embodiment of the present disclosure, FIG. 6 shows a first cross-sectional view taken along line A-A in FIG. 5 according to an embodiment of the present disclosure, and FIG. 8 shows a second cross-sectional view taken along line A-A in FIG. 5 according to another embodiment of the present disclosure.

As shown in FIGS. 5 and 6, in an optional embodiment, the shading lines 1 include a first shading line 11 and a second shading line 12 which are adjacent to each other. A shading pattern 2 is arranged at an area corresponding to an area between the first shading line 11 and the second shading line 12, and a projection of the shading pattern 2 on the base 100 partially overlaps the projections of the first shading line 11 and the second shading line 12 on the base 100, to form a first region 200. If the shading pattern 2 is made of a conductive material, the first region 200 is confined within a very small area, so as to reduce a load of the shading lines 1 when the shading lines 1 are being charged, and the risk of crosstalk between the shading pattern 2 and the shading lines 1 is reduced. Further, as the bezel of the display device becomes narrower, the length of the shading pattern 2 (in the width extension direction of the bezel) is relatively small, the load is added by a small amount, and the risk of crosstalk between the shading pattern 2 and the shading lines 1 is also very small. If the shading pattern 2 is located on the shading lines 1, it enables to prevent the shading lines 1 from being scratched. In addition, as shown in FIG. 8, the first shading line 11, the second shading line 12, and the shading pattern 2 may be arranged on a same layer.

Specifically, the first region 200 may be of a strip-like structure, as shown in FIG. 5. A width of each strip-like structure is in the range of 1.5 μm-4 μm. During the practical manufacturing process, the width of each strip-like structure is greater than 2 μm due to the impact of the process. However, the first region 200 is not limited to the strip-like structure, and may be of any other structure as long as it cooperates with the shape of the shading lines 1 to prevent the whole non-display area of the display substrate 10 from being transmitted light.

The shading pattern 2 may be made of a non-conductive material, and in this case, the shading pattern 2 may be arranged to cover the whole non-display area of the display substrate 10, so that the whole non-display area of the display substrate 10 does not transmit light, and thus the problem of light leakage through the gap at the bezel of the display device is solved.

Certainly, if the shading pattern is made of a non-conductive material, the projection of the shading pattern 2 on the base 100 may also be arranged to partially overlap the projections of the shading lines 1 on the base 100, to form the first region 200.

The TFT-LCD has the advantages of small size, low power consumption, and no radiation. The TFT-LCDs have been rapidly developed in recent years and are dominant in the current flat panel display market. The display panel of the TFT-LCD includes a TFT array substrate 10 and a color filter substrate 20 that are oppositely arranged to form a cell. The TFT array substrate 10 includes a plurality of gate lines and a plurality of data lines that are distributed in a crossing manner to define a plurality of pixel regions in the display area. Each of the pixel regions includes a TFT and a pixel electrode. By turning on the TFTs in each row through the gate lines in a row by row manner, a pixel voltage transmitted through the data line is transmitted to the pixel electrode through the TFT, to form an electric field for driving the liquid crystal molecules to rotate, thereby achieving a display function.

In the case that the display substrate of at least one embodiment of the present disclosure is the TFT array substrate 10 of the TFT-LCD, the shading lines 1 in the non-display area of the array substrate 10 includes gate scanning lines and data driving lines. The shading patterns are arranged respectively at areas corresponding to areas between each two adjacent gate scanning lines, and/or areas corresponding to areas between the each two adjacent data driving lines. The gate scanning lines are configured to provide scanning signals to the gate lines, and the data lines are configured to provide the required pixel voltages to the data lines. The gate scanning lines and the data driving lines are located on two adjacent sides of the array substrate.

Optionally, the shading pattern 2 is simultaneously formed with a certain kind of signal lines of the TFT array substrate 10 through a patterning process of the same film layer, i.e. the shading pattern 2 and the certain kind of signal lines of the TFT array substrate 10 are arranged on the same layer and made of the same material, so that the material and the process for manufacturing the shading patterns 2 are not additionally required, and thus the production costs are reduced.

In at least one embodiment, the shading patterns 2 are only provided at the areas corresponding to the areas between each two adjacent gate scanning lines in the TFT array substrate 10, and the shading patterns 2, the data driving lines and the data lines are arranged on the same layer and made of the same material. Specifically, a source-drain metal layer is formed on the base 100, and subjecting the source-drain metal layer to a patterning process, to form a pattern including the light-shielding patterns 2, the data driving lines, and the data lines. The source-drain metal layer may be made of a metal such as Cu, Al, Ag, Mo, Cr, Nd, Ni, Mn, Ti, or Ta, or an alloy of these metals. The source-drain metal layer may be of a single-layer structure or a multi-layer structure such as Cu\Mo, Ti\Cu\Ti, or Mo\Al\Mo.

In at least one embodiment, the shading patterns 2 are only provided at the areas corresponding to the areas between each two adjacent data driving lines in the TFT array substrate 10, and the shading patterns 2, the gate scanning lines and the gate lines are arranged on the same layer and made of the same material. Specifically, a gate metal layer is formed on the base 100, and subjecting the gate metal layer to a patterning process, to form a pattern including the light-shielding pattern 2, the gate scanning lines, and the gate lines. The gate metal layer is made of a metal such as Cu, Al, Ag, Mo, Cr, Nd, Ni, Mn, Ti, Ta, or W, or an alloy of these metals. The gate metal layer may be of a single-layer structure or a multi-layer structure such as Cu\Mo, Ti\Cu\Ti, or Mo\Al\Mo.

In at least one embodiment of the present disclosure, one portion of the shading patterns is arranged at the areas corresponding to the areas between the each two adjacent gate scanning lines, and the other portion of the shading patterns is arranged at the areas corresponding to the areas between the each two adjacent data driving lines. Optionally, the data driving lines, the data line and the one portion of the shading patterns arranged at the areas corresponding to the areas between the each two adjacent gate scanning lines are arranged on a same layer and made of a same material, and the gate scanning lines, gate line and the other portion of the shading patterns arranged at the areas corresponding to the areas between the each two adjacent data driving lines are arranged on a same layer and made of a same material, the data driving lines and the data lines are arranged on the same layer and made of the same material, so that the material and the process for manufacturing the shading patterns 2 are not additionally required, and thus the production costs are reduced.

In the at least one embodiment of the present disclosure, if the shading lines 1 of are the gate scanning lines (or data driving lines) of the TFT array substrate 10, and the areas corresponding to the areas between each two adjacent gate scanning lines 1 (or data driving lines) are provided with the shading patterns 2 respectively, the projection of the shading pattern 2 on the base is arranged to partially overlap the projections of the gate scanning lines 1 (or data driving lines) on the base 100 to form the first region 200. If the shading pattern 2 is made of a conductive material (in particular, a gate metal or a source-drain metal), the first region 200 is controlled to be within a small range, to reduce the load of the gate scanning lines 1 (or data driving lines) when they are being charged, and reduce the risk of crosstalk between the shading pattern 2 and the gate scanning lines 1 (or data driving lines). Further, as the bezel of the display device becomes narrower, the length of the shading pattern 2 (in the width extension direction of the bezel) is relatively small, the load is added by a small amount, and the risk of crosstalk between the shading pattern 2 and the gate scanning lines (or data driving lines) is also very small. If the shading pattern 2 is located on the gate scanning lines 1 (or data driving lines), it enables to prevent the gate scanning lines (or data driving lines) from being scratched.

As shown in FIGS. 5 and 6, the TFT array substrate of at least one embodiment of the present disclosure specifically includes:

a base 100, such as a glass substrate, a quartz substrate, an organic resin substrate or another transparent substrate;

gate lines, gate scanning lines 1 and gate electrodes of TFTs arranged on the base 100, wherein the gate lines, the gate scanning lines 1 and the gate electrodes of the TFTs are arranged on the same layer and made of the same material, and the gate line and the gate electrode of the TFT are of an integral structure;

a gate insulating layer 101 covering the gate lines, the gate scanning lines 1 and the gate electrodes of the TFTs, wherein the gate insulating layer 101 may be made of oxide, nitride or nitrogen oxide, and may be of a single layer structure, a double layer structure, or a multiple layer structure. Specifically, the material of the gate insulating layer 101 may be SiNx, SiOx or Si (ON)x;

an active layer arranged on the gate insulating layer 101, wherein the active layer may be made of a silicon semiconductor or a metal oxide semiconductor;

data lines, data driving lines (not shown in figures), and source electrodes and drain electrodes of the TFTs arranged on the base 100, wherein the data lines, the data driving lines (not shown in figures), the source electrodes and the drain electrodes of the TFTs are arranged on the same layer and made of the same material, the source electrode and the drain electrode are lapped on two opposite sides of the active layer, and the data line and the source electrode of the TFT are of an integral structure;

a passivation layer 102 covering the TFTs and provided with via holes therein to expose the drain electrodes of the TFTs, wherein the passivation layer 102 may be made of oxide, nitride or nitrogen oxide, and may be of a single layer structure, a double layer structure, or a multiple layer structure; specifically, the material of the passivation layer 102 may be SiNx, SiOx or Si (ON)x; and pixel electrodes arranged on the passivation layer 102 and electrically connected with the drain electrodes of the TFTs through the via holes in the passivation layer 102.

Correspondingly, at least one embodiment of the present disclosure further provides a method of manufacturing a display substrate including a display area and a non-display area surrounding the display area. The method includes:

forming shading patterns on a base and at the non-display area, to prevent light from being transmitted through the non-display area.

In above-mentioned technical solution, due to the shading patterns, the whole non-display area of the display substrate does not transmit light, so that light cannot be transmitted through the non-display area of the display substrate, and thus the problem of light leakage through the gap at the bezel of the display device may be solved.

If the non-display area of the display substrate includes a plurality of shading lines, the method further includes: forming a plurality of shading lines on the base and at the non-display area, to provide display signals to the display area.

Since the shading lines have the shading effect, the step of forming the shading patterns on the base may specifically include: forming the shading patterns respectively at areas at least partially corresponding to areas between each two adjacent shading lines.

By means of the cooperation of the shading patterns formed by the above-mentioned step and the shading lines, the whole non-display area of the display substrate does not transmit light.

In the TFT array substrate, the shading lines specifically include gate scanning lines and data driving lines which are located on two adjacent sides of the array substrate. The step of forming the shading pattern on the base and at the non-display area specifically includes: forming the shading patterns respectively at areas corresponding to areas between the each two adjacent gate scanning lines, and/or at areas corresponding to areas between the each two adjacent data driving lines.

The shading patterns may be made of a conductive material or a non-conductive material.

Optionally, if the shading patterns are made of the conductive material, the shading patterns s simultaneously formed with a certain kind of signal lines of the display panel through a patterning process of the same film layer, i.e. the shading patterns and the certain kind of signal lines of the display panel are arranged on the same layer and made of the same material, so that the material and the process for manufacturing the shading patterns are not additionally required, and thus the production costs are reduced.

In at least one embodiment, in the TFT array substrate, the shading patterns are arranged at the areas corresponding to the areas between the each two adjacent gate scanning lines and are not arranged at the areas corresponding to the areas between the two adjacent data driving lines, the method further comprises:

forming a source-drain metal layer on the base, and subjecting the source-drain metal layer to a patterning process, to form a pattern comprising the shading patterns and the data driving lines.

In at least one embodiment, the shading patterns are arranged at the areas corresponding to the areas between the two adjacent data driving lines and are not arranged at the areas corresponding to the areas corresponding to the areas between the each two adjacent gate scanning lines, the method further comprises:

forming a gate metal layer on the base, and subjecting the gate metal layer to a patterning process, to form a pattern comprising the shading patterns and the gate scanning lines.

Certainly, it is possible that one portion of the shading patterns is arranged at the areas corresponding to the areas between each two adjacent gate scanning lines, and the other portion of the shading patterns is arranged at the areas corresponding to areas between the each two adjacent data driving lines, the method further comprises:

forming a source-drain metal layer on the base, and subjecting the source-drain metal layer to a patterning process, to form a pattern comprising the data driving lines and the portion of the shading patterns arranged at the areas corresponding to areas between the each two adjacent gate scanning lines; and forming a gate metal layer on the base, and subjecting the gate metal layer to a patterning process, to form a pattern comprising the gate scanning lines and the other portion of shading patterns arranged at the areas corresponding to the areas between the each two adjacent gate scanning lines.

At least one embodiment of the present disclosure further provides a display device including the above-mentioned display substrate to solve the problem of light leakage through the gap at the bezel of the display device.

As shown in FIG. 7, the display device may specifically be a TFT LCD, and include a color filter substrate 20. The display substrate 10 is a TFT array substrate which is arranged opposite to the array substrate 10 to form a cell. The color filter substrate 20 includes a black matrix 21. The projection of the black matrix 21 on the array substrate 10 partially overlaps the shading pattern 2 in the non-display area of the array substrate 10. Partially overlapping not only may ensure that the non-display area does not transmit light and save the material for the shading pattern, but also may ensure light cannot be leaked from the gap between the edge of the black matrix 20 and the edge of the color filter substrate 20, thereby solving the problem of light leakage through the gap at the bezel of the display device.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A display substrate, comprising a display area and a non-display area surrounding the display area, wherein shading patterns are formed on a base and at the non-display area, to prevent light from being transmitted through the non-display area,
the non-display area further comprises:
a plurality of shading lines arranged on the base and configured to provide display signals to the display area, wherein
the plurality of shading lines comprises:
a first group of shading lines, wherein the shading patterns are arranged respectively at areas corresponding to areas between each two adjacent shading lines in the first group, and the shading patterns and the first group of shading lines are arranged on a same layer and made of a same material; and/or
a second group of shading lines, wherein the shading patterns are arranged respectively at areas corresponding to areas between each two adjacent shading lines in the second group, and the shading patterns and the second group of shading lines are arranged on a same layer and made of a same material.

2. The display substrate according to claim 1, wherein the shading patterns comprise a first shading pattern and a second shading pattern, wherein the first group of shading lines comprise a first shading line and a second shading line that are adjacent to each other, and the first shading pattern is arranged at an area corresponding to an area between the first shading line and the second shading line, and a projection of the first shading pattern onto the base partially overlaps projections of the first shading line and the second shading line onto the base, to form a first region; or
the second group of shading lines comprise the first shading line and the second shading line that are adjacent to each other, and the second shading pattern is arranged at an area corresponding to an area between the first shading line and the second shading line, and a projection of the second shading pattern onto the base partially overlaps projections of the first shading line and the second shading line onto the base, to form a first region.

3. The display substrate according to claim 2, wherein the first region is of a strip-like structure, and a width of each strip-like structure is in a range between 1.5 µm and 4 µm.

4. The display substrate according to claim 1, wherein
the display substrate is a thin film transistor (TFT) array substrate; and
the first group of shading lines are gate scanning lines, and the second group of shading lines are data driving lines.

5. The display substrate according to claim 4, wherein
the gate scanning lines and the data driving lines are arranged on two adjacent sides of the array substrate; and
in the case that the shading patterns are arranged at the areas corresponding to the areas between the each two adjacent gate scanning lines and are not arranged at the areas corresponding to the areas between the each two adjacent data driving lines, the shading patterns and the data driving lines are arranged on the same layer and made of the same material.

6. The display substrate according to claim 4, wherein
the gate scanning lines and the data driving lines are arranged on two adjacent sides of the array substrate; and
in the case that the shading patterns are arranged at the areas corresponding to the areas between the each two adjacent data driving lines and are not arranged at the areas corresponding to the areas between the each two adjacent gate scanning lines, the shading patterns and the gate scanning lines are arranged on the same layer and made of the same material.

7. The display substrate according to claim 4, wherein
the gate scanning lines and the data driving lines are located on two adjacent sides of the array substrate; and
in the case that one portion of the shading patterns is arranged at the areas corresponding to the areas between the each two adjacent gate scanning lines, and the other portion of the shading patterns is arranged at the areas corresponding to the areas between the each two adjacent data driving lines, the data driving lines and the one portion of the shading patterns arranged at the areas corresponding to the areas between the each two adjacent gate scanning lines are arranged on the same layer and made of the same material, and the gate scanning lines and the other portion of the shading patterns arranged at the areas corresponding to the areas between the each two adjacent data driving lines are arranged on the same layer and made of the same material.

8. The display substrate according to claim 1, wherein the shading patterns cover an entirety of the non-display area of the display substrate.

9. The display substrate according to claim 1, wherein the shading patterns are made of a conductive material or a non-conductive material.

10. A display device, comprising the display substrate according to claim 1.

11. The display device according to claim 10, wherein the display substrate is a thin film transistor (TFT) array substrate, the display device further comprises a color filter substrate, the color filter substrate and the TFT array substrate are oppositely arranged to form a cell, the color filter substrate comprises a black matrix, and a projection of the black matrix onto the array substrate partially overlaps the shading patterns at the non-display area of the array substrate.

12. The display device according to claim 11, wherein the first group of shading lines comprise a first shading line and a second shading line that are adjacent to each other or the second group of shading lines comprise the first shading line and the second shading line, the one of the shading patterns is arranged at an area corresponding to an area between the first shading line and the second shading line, and a projection of the one shading pattern onto the base partially overlaps projections of the first shading line and the second shading line onto the base, to form a first region.

13. The display device according to claim 12, wherein the first region is of a strip-like structure, and a width of each strip-like structure is in a range between 1.5 µm and 4 µm.

14. The display device according to claim 11, wherein
the display substrate is a thin film transistor (TFT) array substrate; and the first group of shading lines are gate scanning lines, and the second group of shading lines are data driving lines.

15. A method of manufacturing a display substrate comprising a display area and a non-display area surrounding the display area, wherein the method comprises:
   forming shading patterns on a base and at the non-display area, to prevent light from being transmitted through the non-display area; and
   forming a plurality of shading lines on the base and at the non-display area, to provide display signals to the display area,
   wherein the plurality of shading lines comprises a first group of shading lines and a second group of shading lines; and
   forming the shading patterns on the base and at the non-display area comprises:
   forming the shading patterns respectively at areas corresponding to areas between each two adjacent shading lines in the first group, and the shading patterns and the first group of shading lines being arranged on a same layer and made of a same material; and/or
   forming the shading patterns respectively at areas corresponding to areas between each two adjacent shading lines in the second group, and the shading patterns and the second group of shading lines being arranged on a same layer and made of a same material.

16. The method according to claim 15, wherein
   the display substrate is a thin film transistor (TFT) array substrate, the first group of shading lines are gate scanning lines, and the second group of shading lines are data driving lines;
   forming the plurality of shading lines on the base and at the non-display area comprises: forming the gate scanning lines and the data driving lines on the base and at the non-display area.

17. The method according to claim 16, wherein
   the gate scanning lines and the data driving lines are arranged on two adjacent sides of the array substrate; and
   in the case that the shading patterns are arranged at the areas corresponding to the areas between the each two adjacent gate scanning lines and are not arranged at the areas corresponding to the areas between the two adjacent data driving lines, the method further comprises: forming a source-drain metal layer on the base, and subjecting the source-drain metal layer to a patterning process, to form a pattern comprising the shading patterns and the data driving lines.

18. The method according to claim 16, wherein
   the gate scanning lines and the data driving lines are arranged on two adjacent sides of the array substrate; and
   in the case that the shading patterns are arranged at the areas corresponding to the areas between the two adjacent data driving lines and are not arranged at the areas corresponding to the areas corresponding to the areas between the each two adjacent gate scanning lines, the method further comprises: forming a gate metal layer on the base, and subjecting the gate metal layer to a patterning process, to form a pattern comprising the shading patterns and the gate scanning lines.

19. The method according to claim 16, wherein
   the gate scanning lines and the data driving lines are located on two adjacent sides of the array substrate, and
   in the case that one portion of the shading patterns is arranged at the areas corresponding to the areas between each two adjacent gate scanning lines, and the other portion of the shading patterns is arranged at the areas corresponding to areas between the each two adjacent data driving lines, the method further comprises:
   forming a source-drain metal layer on the base, and subjecting the source-drain metal layer to a patterning process, to form a pattern comprising the data driving lines and the one portion of shading patterns arranged at the areas corresponding to areas between the each two adjacent gate scanning lines; and
   forming a gate metal layer on the base, and subjecting the gate metal layer to a patterning process, to form a pattern comprising the gate scanning lines and the other portion of shading patterns arranged at the areas corresponding to the areas between the each two adjacent gate scanning lines.

20. The method according to claim 15, wherein forming the shading patterns on the base and at the non-display area comprises:
   forming the shading patterns covering an entirety of the non-display area of the display substrate.

* * * * *